United States Patent
Küls

(10) Patent No.: US 10,566,985 B2
(45) Date of Patent: Feb. 18, 2020

(54) METHOD FOR ANALOG-TO-DIGITAL CONVERSION OF ANALOG INPUT SIGNALS

(71) Applicants: Guido Erwin Küls, Bad Neuenahr Ahrweiler (DE); Anne Amanda Greve, Bad Neuenahr-Ahrweiler (DE)

(72) Inventor: Guido Erwin Küls, Bad Neuenahr Ahrweiler (DE)

( * ) Notice: Subject to any disclaimer, the term of this patent is extended or adjusted under 35 U.S.C. 154(b) by 0 days.

(21) Appl. No.: 16/302,892

(22) PCT Filed: May 18, 2017

(86) PCT No.: PCT/DE2017/100431
§ 371 (c)(1),
(2) Date: Nov. 19, 2018

(87) PCT Pub. No.: WO2017/202416
PCT Pub. Date: Nov. 30, 2017

(65) Prior Publication Data
US 2019/0165801 A1    May 30, 2019

(30) Foreign Application Priority Data
May 23, 2016 (DE) .................... 20 2016 003 454 U

(51) Int. Cl.
*H03M 1/06*    (2006.01)
*H03M 1/16*    (2006.01)

(52) U.S. Cl.
CPC ........... *H03M 1/069* (2013.01); *H03M 1/167* (2013.01)

(58) Field of Classification Search
CPC ...... H03M 1/069; H03M 1/167; H03M 1/164; H03M 1/124

USPC .................................................. 341/155, 143
See application file for complete search history.

(56) References Cited

U.S. PATENT DOCUMENTS

| | | | |
|---|---|---|---|
| 5,274,377 A | 12/1993 | Matsuura et al. | |
| 6,304,206 B1 | 10/2001 | Wada et al. | |
| 8,604,962 B1 * | 12/2013 | Lewyn ................ | H03M 1/0863 341/161 |
| 9,136,857 B2 * | 9/2015 | Bogner ............... | H03M 1/1225 |
| 10,354,741 B2 * | 7/2019 | Chuang ................ | H03M 1/462 |

FOREIGN PATENT DOCUMENTS

EP          0901232 A2    3/1999

* cited by examiner

*Primary Examiner* — Brian K Young
(74) *Attorney, Agent, or Firm* — Smartpat PLC

(57) ABSTRACT

A pipelined analog-to-digital converter has an analog signal input. A first input sample-and-hold circuit is connected to the analog signal input. An amplifier is connected to an output of the first input sample-and-hold circuit. A second input sample-and-hold circuit has an input connected to the analog signal input in parallel to the first input sample-and-hold circuit. An AD/DA conversion path is connected to an output of the second input sample-and-hold circuit. A first output sample-and-hold circuit has an input connected to an output of the amplifier. A second output sample-and-hold circuit has an input connected to the output of the amplifier. The amplifier, the first output sample-and-hold circuit, the second input sample-and-hold circuit, and the AD/DA conversion path are part of a converter stage and outputs of the converter stage are inputs to a following converter stage.

10 Claims, 9 Drawing Sheets

Prior Art

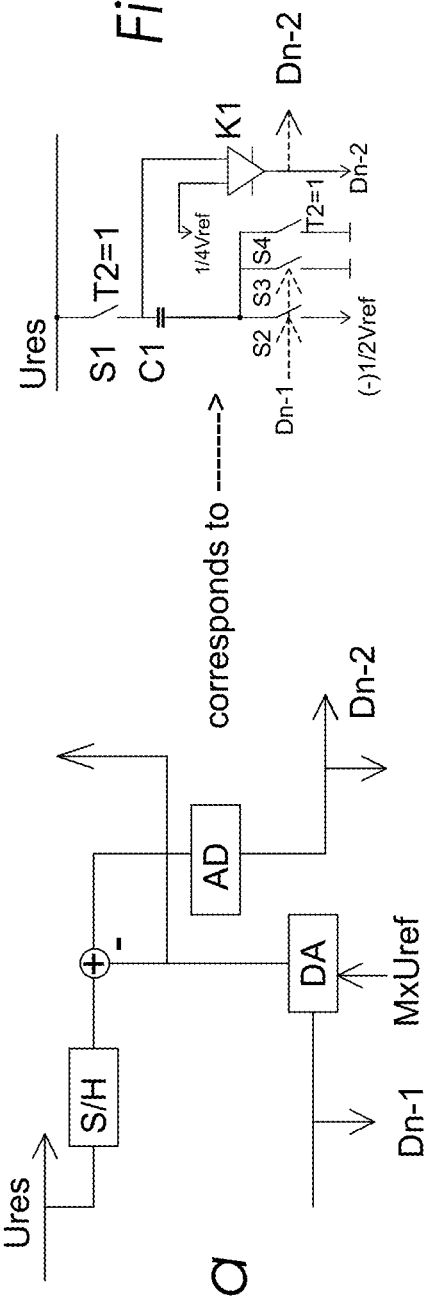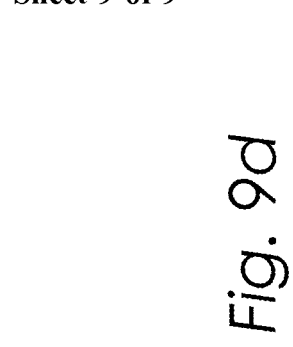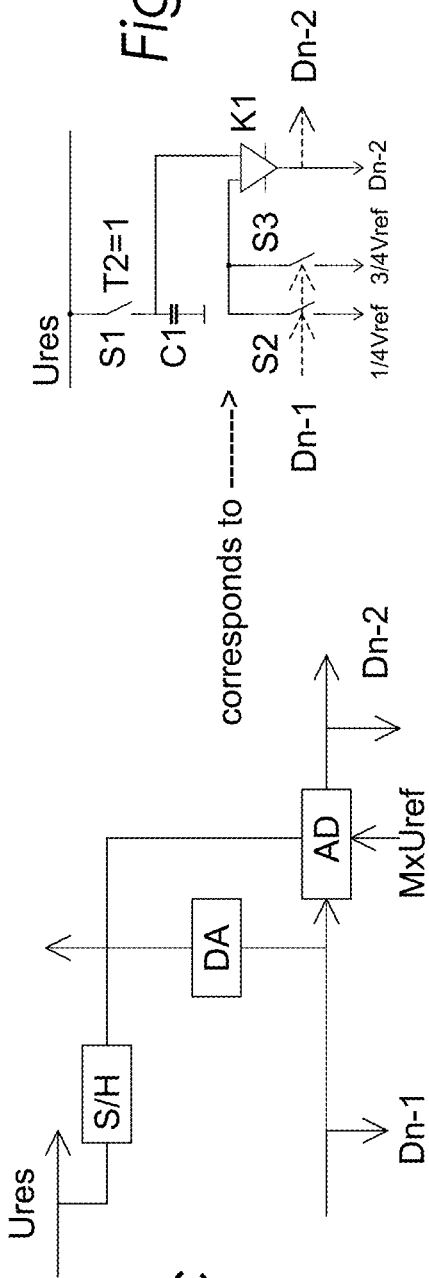

METHOD FOR ANALOG-TO-DIGITAL CONVERSION OF ANALOG INPUT SIGNALS

TECHNICAL FIELD

The present invention relates to a method for the analog-to-digital conversion of analog input signals into a digital data stream and to pipelined analog-to-digital converters.

BACKGROUND

In the course of the advancing digitalization in signal processing and the transmission of electrical signals, which are available in analog form at the beginning, faster and faster analog/digital converters are required. Pipelined ADCs, which have been known for several years, are a well-known architecture for this, with their high conversion rate and justifiable technical circuit complexity and thus a small chip area. However, this arrangement at the block diagram level is not optimal in the sequence of time.

SUMMARY

The present invention is therefore based on the object of creating an analog-to-digital conversion method and a pipelined analog-to-digital converter that eliminate the aforementioned problems and operate at high frequencies.

This object is accomplished by a method for analog-to-digital conversion of analog input signals into a digital data stream which includes the following steps:
  providing an analog input signal to a first input sample-and-hold circuit and to a parallel second input sample-and-hold circuit;
  storing the analog input signal in the first input sample-and-hold circuit and in the parallel second input sample-and-hold circuit;
  passing the analog input signal stored in the first input sample-and-hold circuit to an amplifier of a converter stage;
  passing the analog input signal stored in the parallel second input sample-and-hold circuit to an AD/DA conversion path of the converter stage;
  generating, within the AD/DA conversion path, high-order bits;
  amplifying the analog input signal, by the amplifier, to create an amplified signal;
  storing the amplified signal in a first output sample-and-hold circuit and in a parallel second output sample-and-hold circuit; and
  passing outputs of the first output sample-and-hold circuit, the parallel second output sample-and-hold circuit, and the AD/DA conversion path to a following converter stage.

Storing the analog input signal in the first input sample-and-hold circuit and in the parallel second input sample-and-hold circuit is performed during an odd cycle $T1_H$ while the AD/DA conversion path operates in parallel with the amplifier, the first output sample-and-hold circuit, and the second output sample-and-hold circuit during a subsequent even cycle $T2_H$.

Amplifying the analog input signal by the amplifier may be performed with an amplification factor Vu=1 or with an amplification factor Vu>=2.

Passing outputs of the AD/DA conversion path to the following converter stage may include passing a digital signal from an analog-to-digital converter of the converter stage to an analog-to-digital converter of the following converter stage and passing an analog output of a digital-to-analog converter to a summation node of the following converter stage. The digital-to-analog converter may be connected in series with the analog-to-digital converter.

An improved pipelined analog-to-digital converter includes an analog signal input. A first input sample-and-hold circuit has an input connected to the analog signal input. It includes an amplifier. An input of the amplifier is connected to an output of the first input sample-and-hold circuit. A second input sample-and-hold circuit has an input connected to the analog signal input in parallel to the first input sample-and-hold circuit. An AD/DA conversion path has an input connected to an output of the second input sample-and-hold circuit. A first output sample-and-hold circuit having an input connected to an output of the amplifier. A second output sample-and-hold circuit has an input connected to the output of the amplifier. The amplifier, the first output sample-and-hold circuit, the second input sample-and-hold circuit, and the AD/DA conversion path are part of a converter stage. Outputs of the converter stage are inputs to a following converter stage.

The AD/DA conversion path may include an analog-to-digital converter which converts an analog input signal into high-order bits and a digital-to-analog converter which converts the high-order bits into an analog output signal. An AD/DA conversion path of the following converter stage may be operatively connected to the second output sample-and-hold circuit and to the analog-to-digital converter of the converter stage.

The following converter stage may include a first summation node receiving inputs from the first output sample-and-hold circuit and from the AD/DA conversion path of the converter stage. The first summation node may provide an output to an amplifier of the following converter stage. A second summation node may receive inputs from the second output sample-and-hold circuit and from the AD/DA conversion path of the converter stage and provide an output to an AD/DA conversion path of the following converter stage.

The converter stage may be a second stage of the pipelined analog-to-digital converter and the following converter stage may be a third stage of the pipelined analog-to-digital converter.

The analog signal input may be an output of an amplifier circuit. The input of the amplifier may be connected to the output of the first input sample-and-hold circuit through a first summation node and the input of the AD/DA conversion path may be connected to the output of the second input sample-and-hold circuit through a second summation node.

Further objectives, features, advantages and possible applications of the method according to the invention are given in the following description of embodiments on the basis of the drawings.

BRIEF DESCRIPTION OF THE DRAWINGS

FIG. 9a shows a partial circuit from FIG. 3.

FIG. 9b shows a partial circuit at the component level according to FIG. 3.

FIG. 9c shows a partial circuit from FIG. 6.

FIG. 9d shows a partial circuit at the component level according to FIG. 6 and FIG. 8.

DETAILED DESCRIPTION

Figure 1:
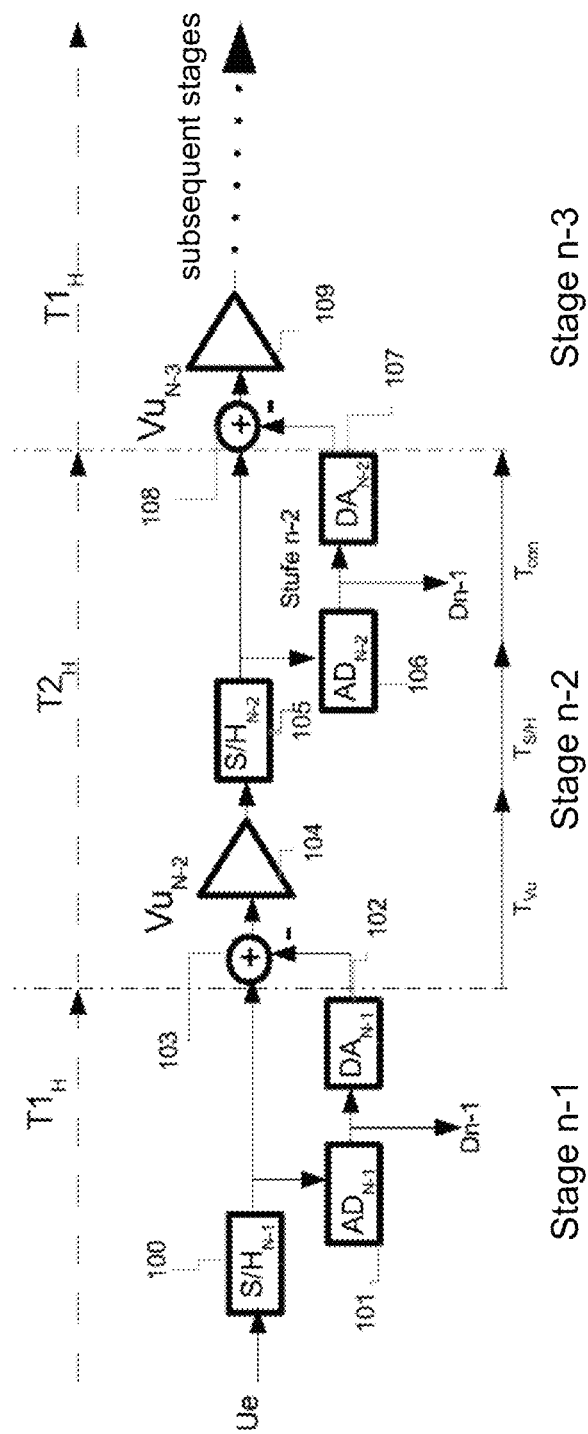
FIG. 1 is a block diagram level of a method for the analog-to-digital conversion and converting of analog input signals into a digital data stream with several stages n-1, n-2, n-3.

FIG. 1 illustrates a block diagram level of a method for the analog-to-digital conversion and converting of analog input signals into a digital data stream with several stages n-1, n-2, n-3.

$T_{total1} = T_{Vu} + T_{SH} + T_{con}$ thereby corresponds to $T2_H = T1_H$
$T2_H, T1_H$: High level of the cycle signals T2, T1.

A closer look at the sequences on the block diagram level according to FIG. 1 shows that, within the individual converter stages (sub-ADCs) in stage n-2 (for example), a chronologically serial arrangement of the AD/DA path 106/107 along with Vu (amplifier stages) 104 and S/H stages 105 (sample and hold elements) are present.

Here, the highest-order bit Dn-1 is generated in the input stage (stage n-1), formed from the sample and hold element S/H$_N$ 100 for the AD/DA path 101/102. Subsequently, the residual signal is formed at the summation node 102 in stage n-2, and the signal is amplified with the amplifier Vu$_{N-1}$ 104 by (for example) a factor of 2 (with one bit conversion per stage); accordingly, there is a storage in 105 of the analog or residual signal with subsequent AD/DA conversion 106/107 and, in stage n-3, there is once again amplification of the signal in 109 by (for example) a factor of 2. Thereby, amplification 104, storage 105 and AD/DA processing 106/107 up to the next Vu stage 109 take place at the same cycle time (in this case, T2$_H$) in an order that is chronologically serial, one after the other.

Thereby, the Vu$_{N-3}$ stage 109 waits until the processes within T2$_H$ have been completed and then forwards the signal for realizing another bit (or additional bits) to the next stage. The required total time $T_{total1}$ arises from the time for the $T_{AD/DA}$ along with the required time for the amplification $T_{Vu}$ and the storage TS$_H$ in the sample and hold element with $T_{total1} = T_{AD/DA} + T_{Vu} + T_{SH}$.

Figure 2:
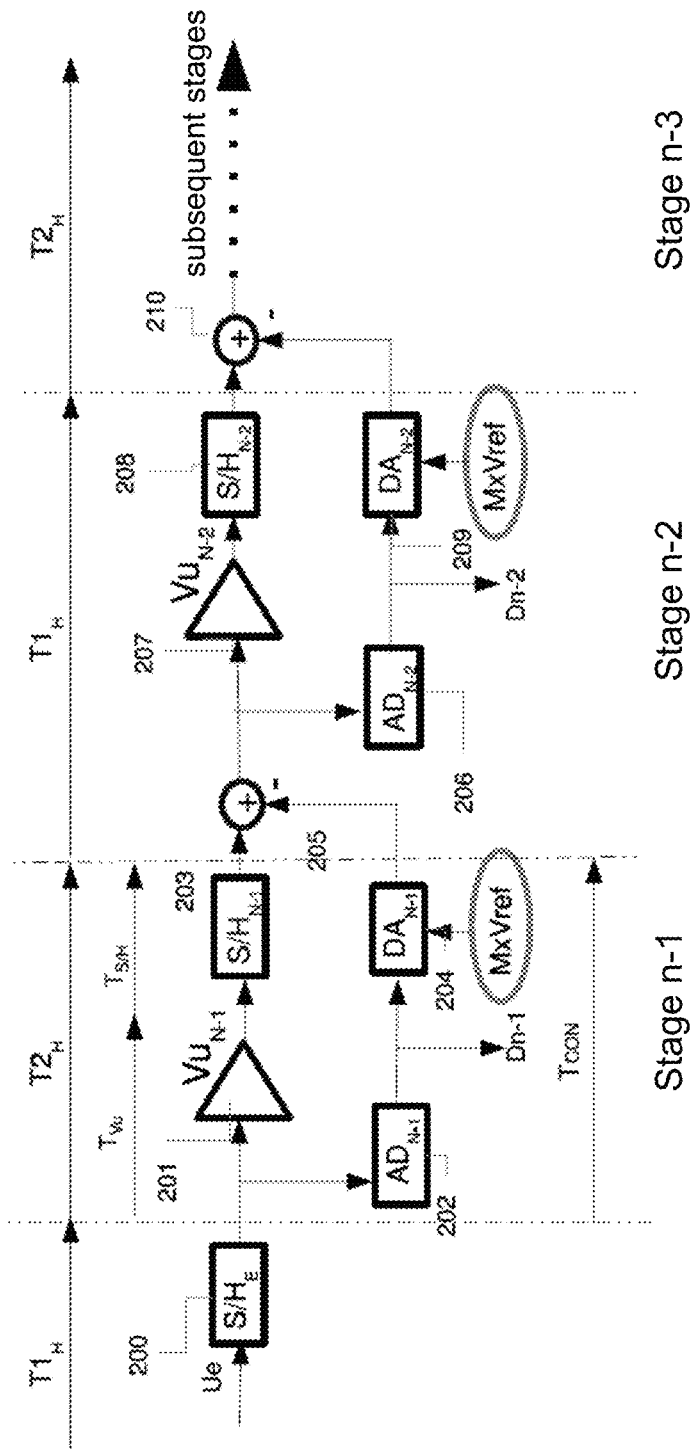
FIG. 2 is a block diagram based on the method according to the invention, with which the AD/DA path operates in time parallel time with an amplifier and a memory device 203 of the same cycle; with: $T_{con} \sim T_{VU} + T_{S/H}$ ist $T_{ges} = T_{con} = T_{VU} + T_{S/H}$, corresponding here to $T2_H = T1_H$; $T2_H$, $T1_H$: high level of the cycle signals T2, T1.

Referring to FIG. 2, with an improved method for the analog-to-digital conversion and realization of analog input signals into a digital data stream with at least one AD/DA path 202, 204, high-order bits D$_{n-1}$ are generated within a cycle time $T_{AD/DA}$, whereas at least one amplifier 201 amplifies the signal within a cycle time $T_{VU}$ and the signal is stored by means of at least one memory device 203 within a cycle time $T_{SH}$.

According to the illustration in FIG. 2, the method is characterized by the fact that the AD/DA path (202, 204) operates in time parallel with at least one amplifier 201 and the memory device 203 in the same cycle T1$_H$. Thereby, the summation node 205 is located behind the memory element S/H$_{N-1}$ 203.

If the hardware requirements are formed in such a manner that $T_{AD/DA} = T_{VU} + T_{SH}$, the total time $T_{total2}$ according to FIG. 2 results from the time for the upper path Tvu (time for the amplification) plus the time for the storage of the signal $T_{SH}$ or the time for the AD/DA conversion in the lower path, within a stage according to $T_{total2} = T_{AD/DA} = T_{VU} + T_{SH}$.

The total time $T_{total2}$ is thereby reduced to $T_{total2} = T_{total1}/2$ in comparison with the total time $T_{total1}$ set forth above or, with $f_{Cycle} = 1/T_{total}$, $f_{Cycle2} = 2 \times f_{Cycle1}$ arises and thereby leads to a doubling of the sample rate or conversion rate.

Thereby, $T_{total1}$, is the conversion time of a sub-ADC according to the state of the art and $T_{total2}$ is the conversion time in the modified form within the meaning of the invention.

Thus, in the best case, an improvement of the conversion rate up to a doubling is possible. In the less optimal case, in which $T_{AD/DA}$ turns out as > or < $T_{VU} + T_{SH}$, $T_{total2}$ results from the longer time span.

Figure 3:
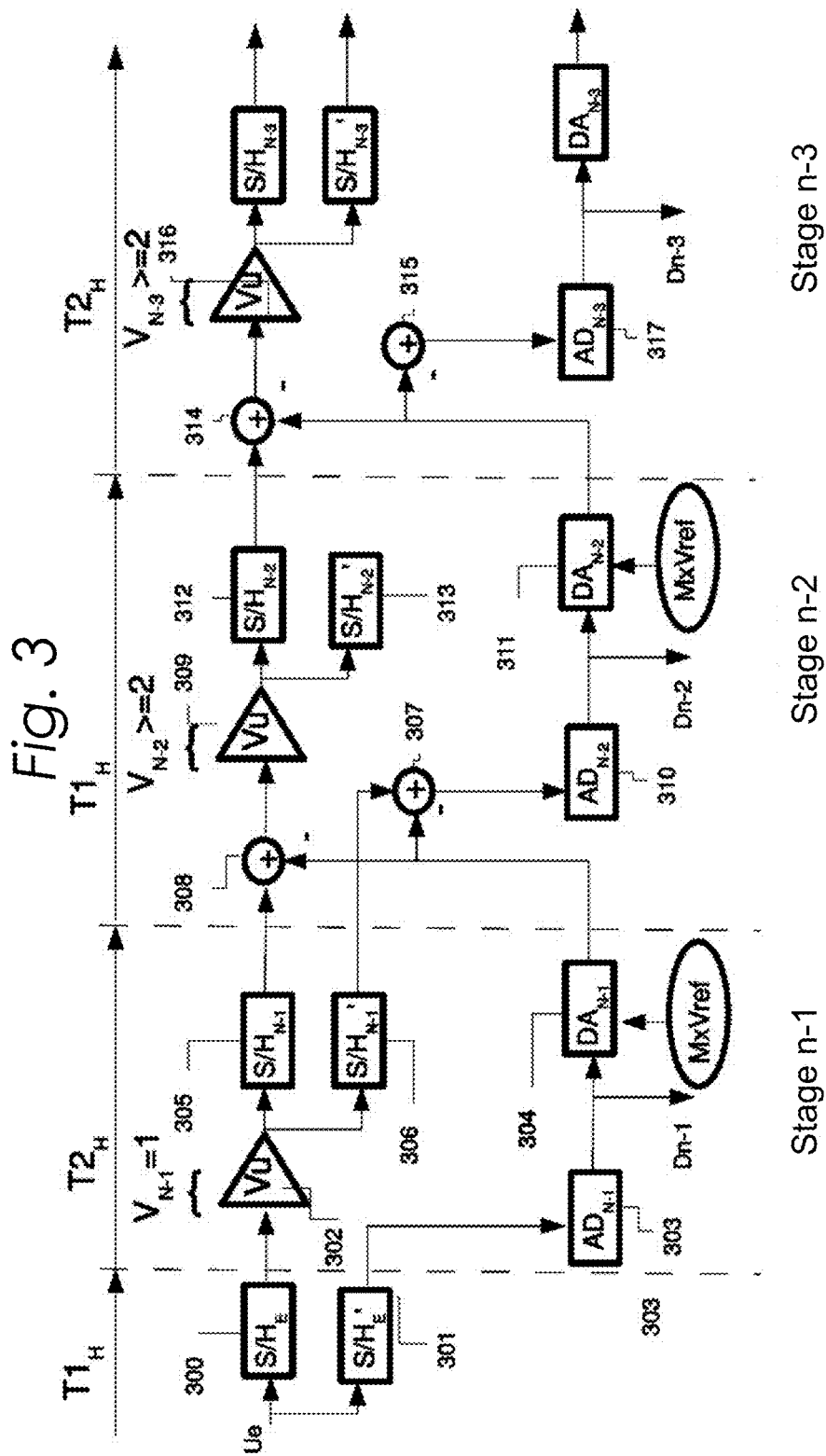
FIG. 3 is a block diagram showing a particularly preferred extension of the embodiment of the invention shown in FIG. 2 for use in SC technology (switched capacitor).

FIG. 3 shows a particularly preferred extension of the version of the invention shown in FIG. 2 for use in SC technology (switched capacitor). Thereby, in the S/H stages 300 and 301, the analog input signal is stored with the cycle T1$_H$.

During T2$_H$, the stored signal is simultaneously transmitted in the upper path to amplifier 302 and in the lower path to AD block 303, and D$_{n-1}$ is generated.

The amplification of the input-side amplifier 302 preferably amounts to Vu=1, so that the analog signal at the output of 302 does not exceed the maximum input voltage. Alternatively, the total amplification Vu of the input signal within the entire input stage can be equal to 1. Compared to 103, there is no subtraction from the DA stage here. Likewise, in comparison to FIG. 2, in FIG. 3, a further SH element 301 must be inserted parallel to 300.

Currently, in customary SC technology, the SH element 100 of FIG. 1 is, in terms of hardware, is switched together with the Vu$_{N-1}$ stage 104 in the following cycle. In FIG. 3, however, stages 303 and 305 operate during the same cycle T2$_H$, whereas 300 is also switched together with 302 here, and 301 keeps ready the signal for 303. In addition, during T2$_H$, the storage takes place in 305 and 306. At the output of 308 and 307, the residual signal is formed during a new cycle T1$_H$.

From here, the Vu$_{N-2}$ stage 309 amplifies with a factor of 2 (with one-bit realization per stage shown here). During T1$_H$, 310 generates the binary value Dn-2. Together with the signal via 311 and 312, 313 generates a subsequent residual signal in the upper signal path and, with 317 generates the binary value Dn-3 and so on.

Figure 4:
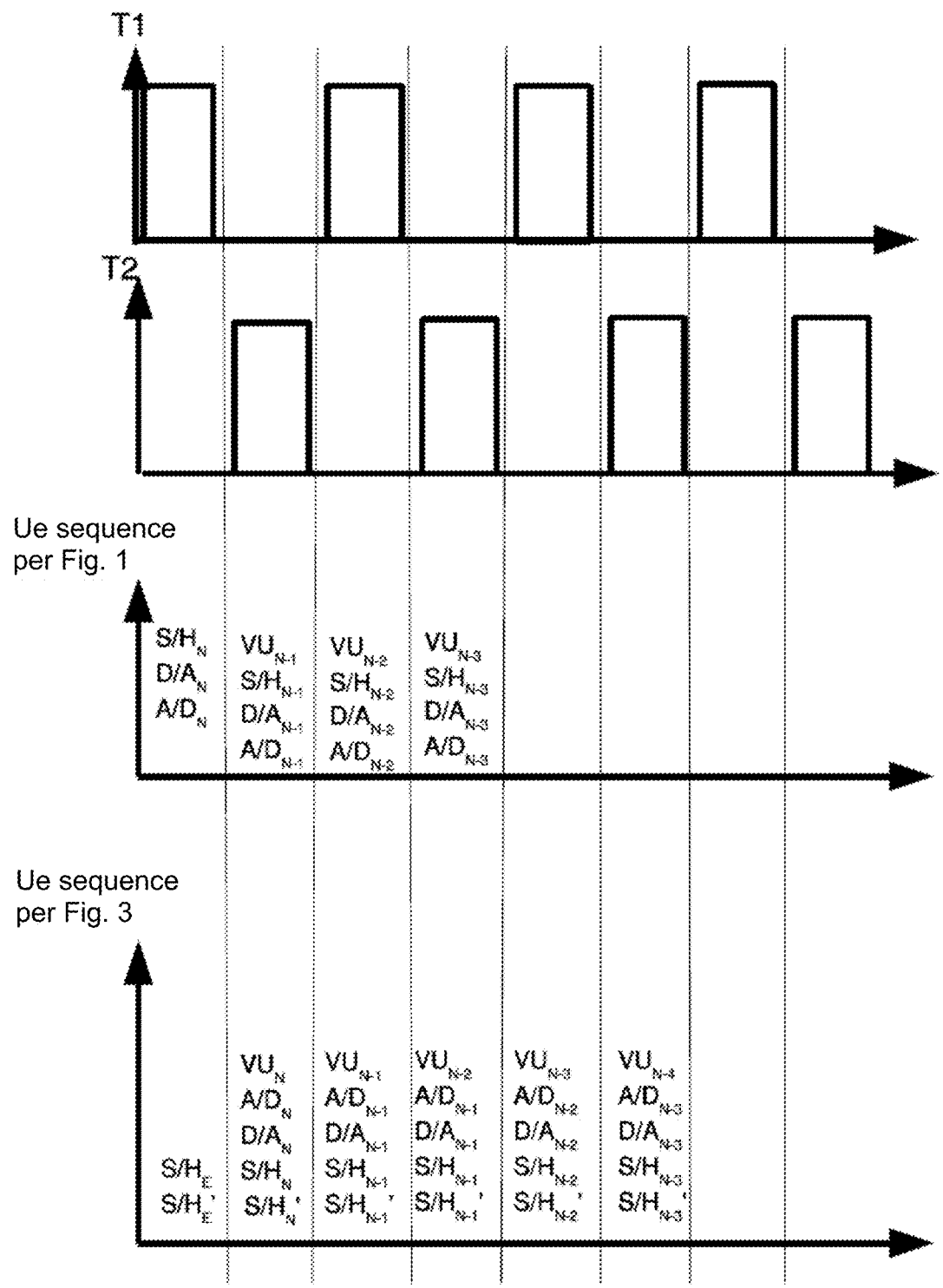
FIG. 4 shows the sequence of time of the conversion of an input signal Ue within the individual converter stages with the cycle times T1 and T2 in comparison to the sequences according to the arrangement within the meaning of the invention according to FIG. 3.

FIG. 4 also shows the sequence of time of the realization of the input signal Ue within the individual converter stages with the cycle times T1 and T2 in comparison to the sequences according to the arrangement within the meaning of the invention according to FIG. 3.

FIG. 9b shows a realization at the component level of S/H$_{N-1}$' 306 AD$_{N-1}$ 303, along with DA$_{N-1}$ 304 and AD$_{N-2}$ 310 with the summation node 307. Together with C1, S1 forms the sample and hold element and corresponds to the S/H' block in FIG. 3 or FIG. 9A.

While, according to FIG. 3, a subtraction of the signal of D$_{n-1}$ converted back into AD$_{n-1}$ (304) is conducted from the residual signal at the summation node (307), and the result is passed on to AD$_{n-2}$ (310), it is also possible to relocate this subtraction within the AD block (see FIGS. 9a, 9b, 9c, 9d). This results in the block diagram according to FIG. 6. Here, the signal Dn-1 is fed directly from block AD$_{n-1}$ to block Adn-2 (610).

Within the block ADN-2 (610) a following conversion with the result Dn-2 is conducted by switching the weighted reference voltages MX V$_{ref}$.

The DA block is formed by the switches S2, S3, S4, which switch the individual reference voltages (−) ½ Uref or ground (oV) at the base point of the capacitance of the S/H' block, depending on the switching condition that is marked.

At the same time, the subtraction of Ures−U$_{AD}$ as the reference voltage is thereby generated at the comparator. The residual signal minus the voltage from the AD converter. With FIG. 9d, FIG. 9c shows the equivalent circuit preferably to be used for this purpose. Thereby, the subtraction of Ures−.U$_{AD}$ is relocated to the input of the comparator. Instead, the reference voltage ¼ Uref and ¾ Uref is switched at the inverting input, depending on Dn-1. The base point of the capacitance C1 is thereby fixed to GND (oV). The stored voltage of C1 is applied to the non-inverting input.

Figure 6:
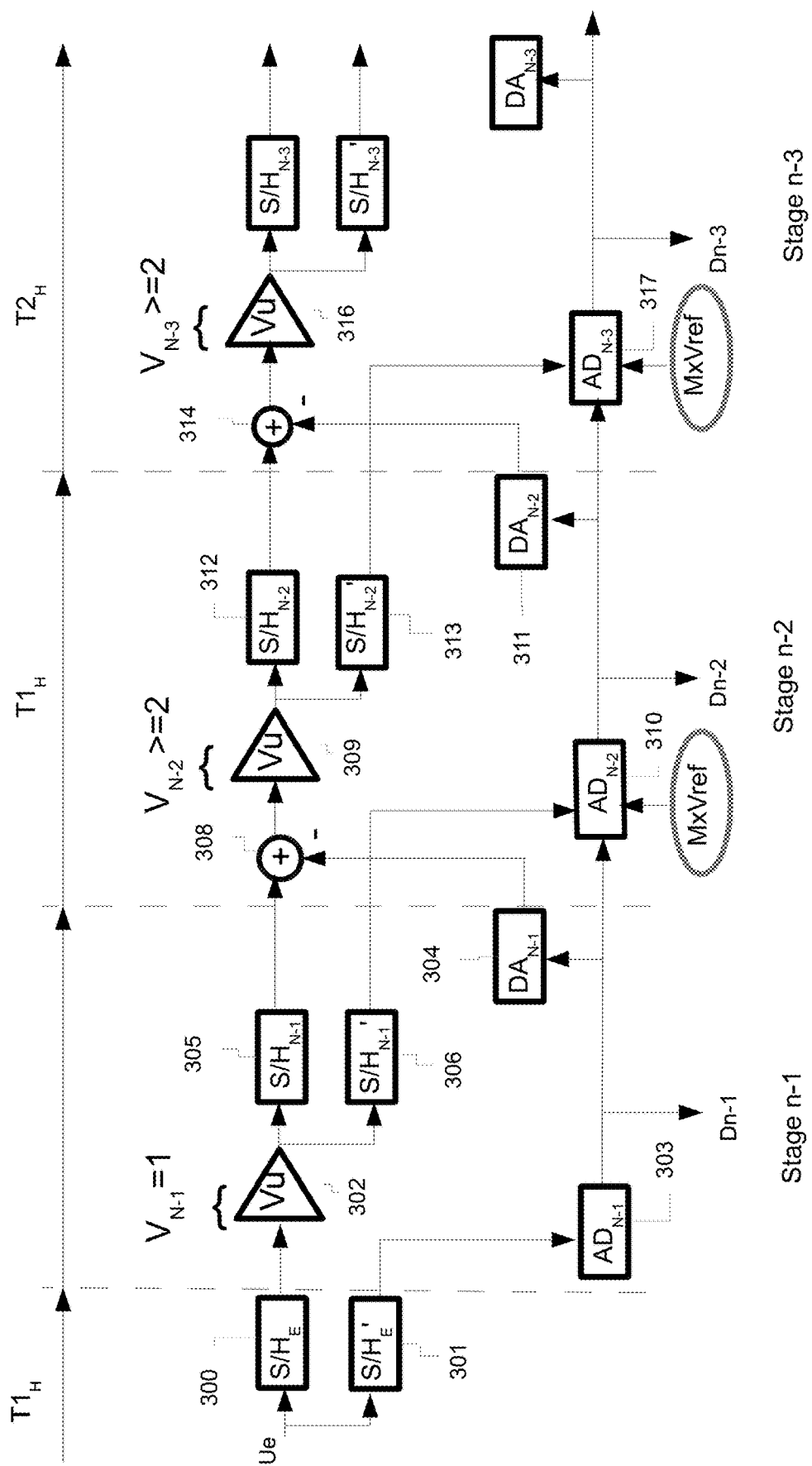
FIG. 6 is a block diagram showing a modification of the circuit of FIG. 3.

This results in a modification of the circuit from FIG. 3 to the circuit FIG. 6. The block S/h$_{N-1}$' leads the residual signal to AD$_{N-2}$. The conversion event Dn-1 switches within AD$_{N-2}$ the reference voltages MxUref e.g. ¼ Uref or ¾ Uref. This then generates the conversion result Dn-2 etc. with the residual signal from S/H$_{N-2}$.

In principle, it is possible to transfer the principle of FIG. 3 and FIG. 6 to converters with multi-stage sub-ADCs with additional comparators and reference voltages.

Figure 5A:
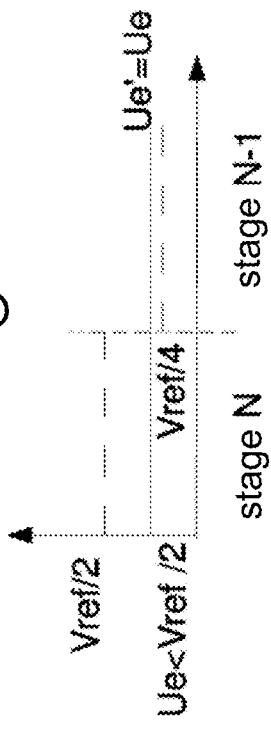
FIG. 5a and FIG. 5b are diagrams showing the voltage and switching conditions for FIG. 3; at Ue>Vref/2→Dn=1, →Ue'=Ue−Vref/2→ from stage n-1 continues to apply with Vref/4 and, at Ue>Vref/2→Dn=0, →Ue'=Ue−=V→ from stage n-1 continues to apply with Vref/4.
Figure 5B:
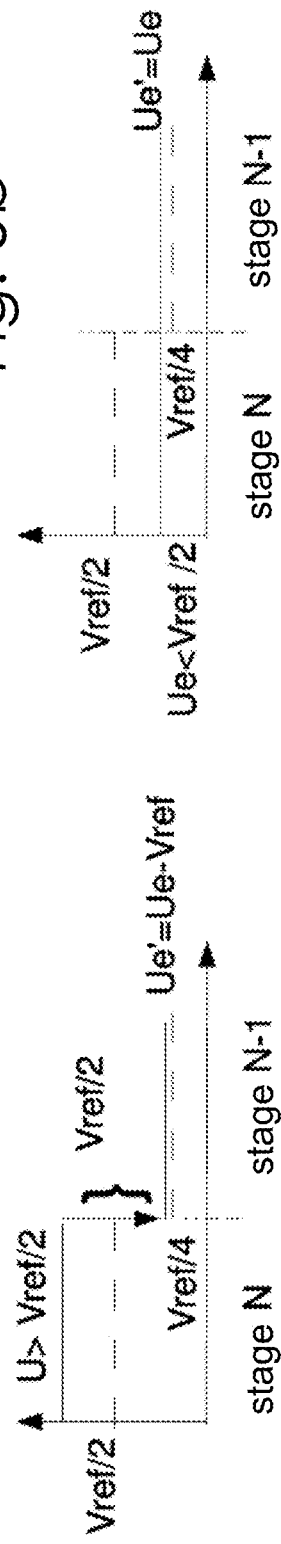
Figure 5C:
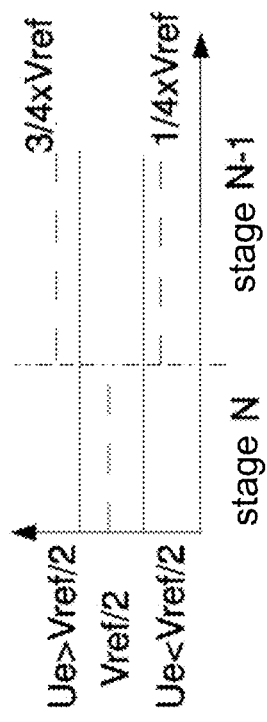
FIG. 5c illustrates the voltage level for the variant of FIG. 6; at Ue>Vref/2→Dn=1, →Ue'=Ue→ from stage n-1 continues to apply with ¾ Vref and, at Ue>Vref/2→Dn=0, →Ue'=Ue→ from stage n-1 continues to apply with ¼ Vref.

FIG. 5 provides a further illustration of the applied reference voltages. FIG. 5a) and FIG. 5b) indicate the voltage and switching conditions for FIG. 3. FIG. 5c) indicates the voltage levels for the variant of FIG. 6.

The signal D$_{n-1}$ preferably can be fed to block AD$_{n-1}$ (603) and/or block AD$_{n-2}$ (610), and thus at least one weighted reference voltage can be switched on or off in order to generate the binary value D$_{n-2}$ with the residual signal from S/H n-1 (606).

Figure 7:
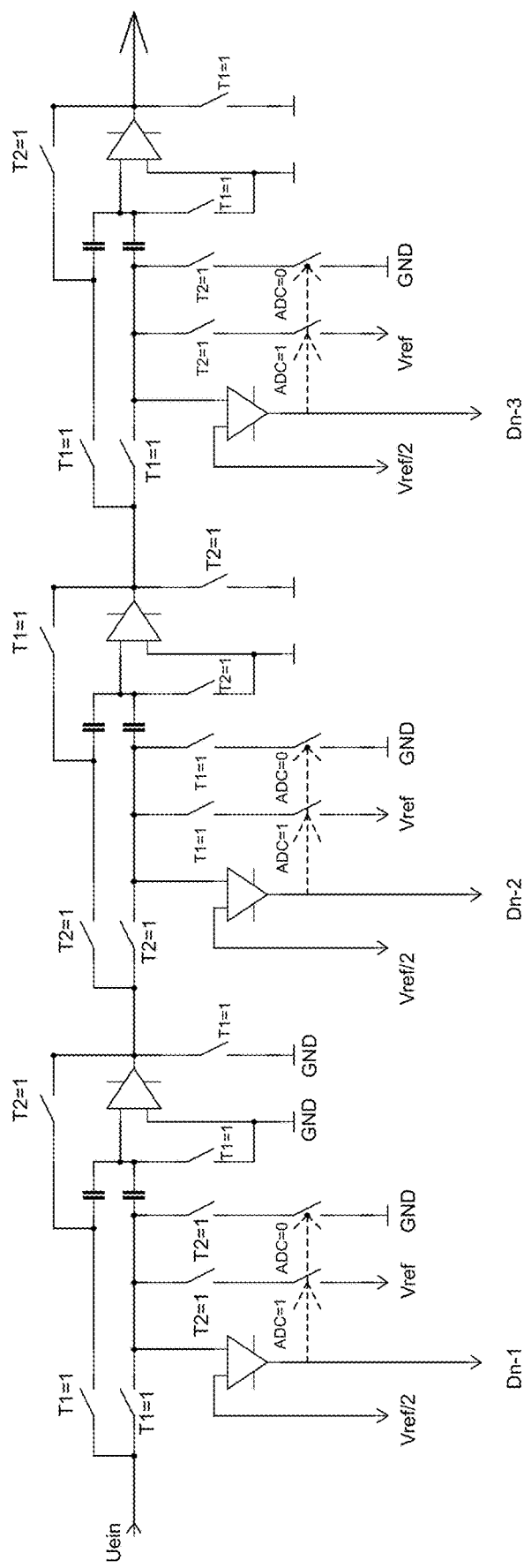
FIG. 7 is a circuit diagram of a state-of-the-art pipeline converter with 1 bit per stage.
Figure 8:
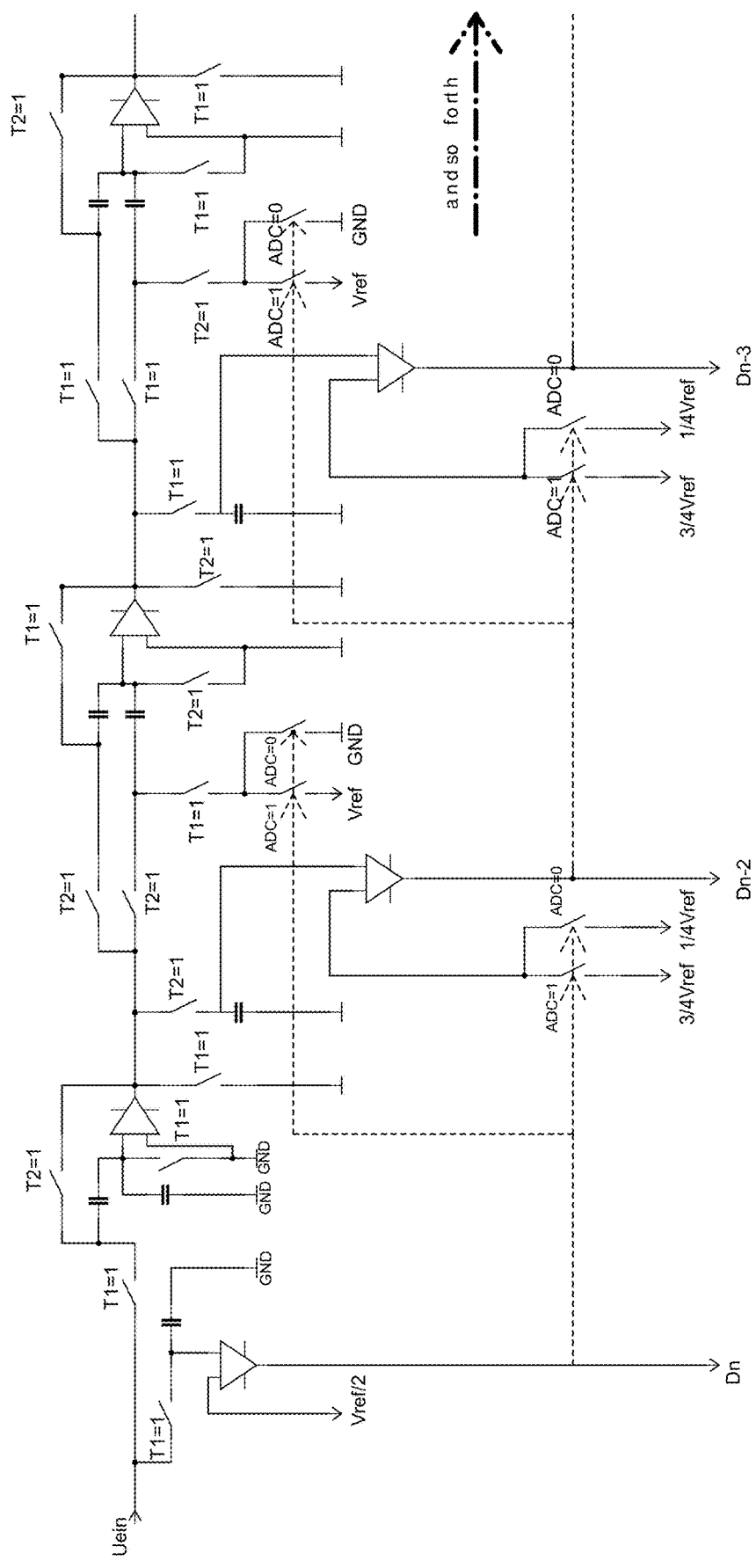
FIG. 8 shows an embodiment of the invention at the circuit diagram level for the first three stages of the pipeline converter according to FIG. 7.

FIG. 8 also shows one embodiment of the invention at the circuit diagram level for the first three stages of the pipeline converter compared to the state of the art according to FIG. 7, with which the comparators switch to V$_{ref}$ or GND with D$_{n-x}$ via a line of action.

The pipelined ADC versions shown here with exemplary one-bit converters per stage can be adapted to higher-resolution stages by trained specialists with suitable multi-bit AD stages and reference voltages.

The invention can also be combined and applied with previous techniques such as pipelined ADCs with double sampling and calibrated pipelined ADCs.

Possible fields of application of the invention are areas in which very fast analog-to-digital conversion is required, such as very fast image recording or measurement technology.

The method can also be applied to ADCs, which convert several bits per stage or ad blocks and thus at higher-resolution sub-ADCs.

The method according to the invention is not limited in its design to the preferred forms of design specified above. Rather, a large number of design variations, which make use of the solution presented even with fundamentally different designs, are conceivable.

The invention claimed is:

1. A method for analog-to-digital conversion of analog input signals into a digital data stream, comprising:
   providing an analog input signal to a first input sample-and-hold circuit and to a parallel second input sample-and-hold circuit;
   storing the analog input signal in the first input sample-and-hold circuit and in the parallel second input sample-and-hold circuit;
   passing the analog input signal stored in the first input sample-and-hold circuit to an amplifier of a converter stage;
   passing the analog input signal stored in the parallel second input sample-and-hold circuit to an AD/DA conversion path of the converter stage;
   generating, within the AD/DA conversion path, high-order bits;
   amplifying the analog input signal, by the amplifier, to create an amplified signal;
   storing the amplified signal in a first output sample-and-hold circuit and in a parallel second output sample-and-hold circuit; and
   passing outputs of the first output sample-and-hold circuit, the parallel second output sample-and-hold circuit, and the AD/DA conversion path to a following converter stage.

2. The method according to claim 1,
   wherein storing the analog input signal in the first input sample-and-hold circuit and in the parallel second input sample-and-hold circuit is performed during an odd cycle T1$_H$ and
   wherein the AD/DA conversion path operates in parallel with the amplifier, the first output sample-and-hold circuit, and the second output sample-and-hold circuit during a subsequent even cycle T2$_H$.

3. The method according to claim 1, wherein amplifying the analog input signal by the amplifier is performed with an amplification factor Vu=1.

4. The method according to claim 1, wherein amplifying the analog input signal by the amplifier is performed with an amplification factor Vu>=2.

5. The method according to claim 1, wherein passing outputs of the AD/DA conversion path to the following converter stage comprises
   passing a digital signal from an analog-to-digital converter of the converter stage to an analog-to-digital converter of the following converter stage and
   passing an analog output of a digital-to-analog converter to a summation node of the following converter stage, the digital-to-analog converter being connected in series with the analog-to-digital converter.

6. A pipelined analog-to-digital converter, comprising:
   an analog signal input;
   a first input sample-and-hold circuit having an input connected to the analog signal input;
   an amplifier, an input of the amplifier being connected to an output of the first input sample-and-hold circuit;

a second input sample-and-hold circuit having an input connected to the analog signal input in parallel to the first input sample-and-hold circuit;

an AD/DA conversion path having an input connected to an output of the second input sample-and-hold circuit;

a first output sample-and-hold circuit having an input connected to an output of the amplifier; and a second output sample-and-hold circuit having an input connected to the output of the amplifier, wherein the amplifier, the first output sample-and-hold circuit, the second input sample-and-hold circuit, and the AD/DA conversion path are part of a converter stage and wherein outputs of the converter stage are inputs to a following converter stage.

7. The pipelined analog-to-digital converter as in claim 6, wherein the AD/DA conversion path comprises an analog-to-digital converter which converts an analog input signal into high-order bits and a digital-to-analog converter which converts the high-order bits into an analog output signal, and wherein an AD/DA conversion path of the following converter stage is operatively connected to the second output sample-and-hold circuit and to the analog-to-digital converter of the converter stage.

8. The pipelined analog-to-digital converter as in claim 6, wherein the following converter stage comprises:

a first summation node receiving inputs from the first output sample-and-hold circuit and from the AD/DA conversion path of the converter stage and providing an output to an amplifier of the following converter stage; and a second summation node receiving inputs from the second output sample-and-hold circuit and from the AD/DA conversion path of the converter stage and providing an output to an AD/DA conversion path of the following converter stage.

9. The pipelined analog-to-digital converter as in claim 6, wherein the converter stage is a second stage of the pipelined analog-to-digital converter and wherein the following converter stage is a third stage of the pipelined analog-to-digital converter.

10. The pipelined analog-to-digital converter as in claim 6, wherein:

the analog signal input is an output of an amplifier circuit;

the input of the amplifier is connected to the output of the first input sample-and-hold circuit through a first summation node; and the input of the AD/DA conversion path is connected to the output of the second input sample-and-hold circuit through a second summation node.

* * * * *